United States Patent [19]

Gfeller et al.

[11] Patent Number: 4,762,354
[45] Date of Patent: Aug. 9, 1988

[54] DEVICE FOR PICKING AND TRANSPORTING COMPONENTS

[75] Inventors: Martin Gfeller, Schalunen; Rudolf Wanner, Rüttenen, both of Switzerland

[73] Assignee: Zevatech AG, Bellach, Switzerland

[21] Appl. No.: 929,993

[22] Filed: Nov. 12, 1986

[30] Foreign Application Priority Data

Nov. 12, 1985 [CH] Switzerland .......................... 4831/85

[51] Int. Cl.⁴ ...................... B25J 15/06; B65G 47/91
[52] U.S. Cl. .......................................... 294/2; 29/743; 294/64.1
[58] Field of Search ...................... 294/2, 64.1; 29/740, 29/743; 248/362, 363; 269/21; 271/90, 91, 94, 107; 279/3; 414/627, 737, 744 B, 752; 901/40

[56] References Cited

U.S. PATENT DOCUMENTS

| | | | |
|---|---|---|---|
| 3,841,687 | 10/1974 | Banyas et al. | 294/64.1 |
| 4,559,718 | 12/1985 | Tadokoro | 294/64.1 X |
| 4,610,473 | 9/1986 | Hawkswell | 294/64.1 |
| 4,624,050 | 11/1986 | Hawkswell | 294/64.1 X |

FOREIGN PATENT DOCUMENTS

| | | | |
|---|---|---|---|
| 3102206 | 8/1982 | Fed. Rep. of Germany | 294/64.1 |
| 13165 | 1/1979 | Japan | 294/64.1 |
| 131129 | 7/1985 | Japan | 294/64.1 |
| 1193921 | 6/1970 | United Kingdom | 294/64.1 |
| 1055567 | 11/1983 | U.S.S.R. | 901/40 |

Primary Examiner—Johnny D. Cherry
Attorney, Agent, or Firm—Tarolli, Sundheim & Covell

[57] ABSTRACT

The device for picking and transporting components of different size has a gripping casing (1) which comprises a plurality of concentrically arranged, axially movable gripping elements (4, 8, 11). The elements move telescopically relative to each other, and each have a suction opening arranged at the end and connected, according to the working position, with a vaccuum inlet (3). For picking up a small part, only the innermost, smallest gripping element operates. In picking up a middle-size part, the innermost gripping element (11) and the middle gripping element (8) work together, while in the gripping of a large part, the outermost gripping element (4) is additionally actuated.

14 Claims, 3 Drawing Sheets

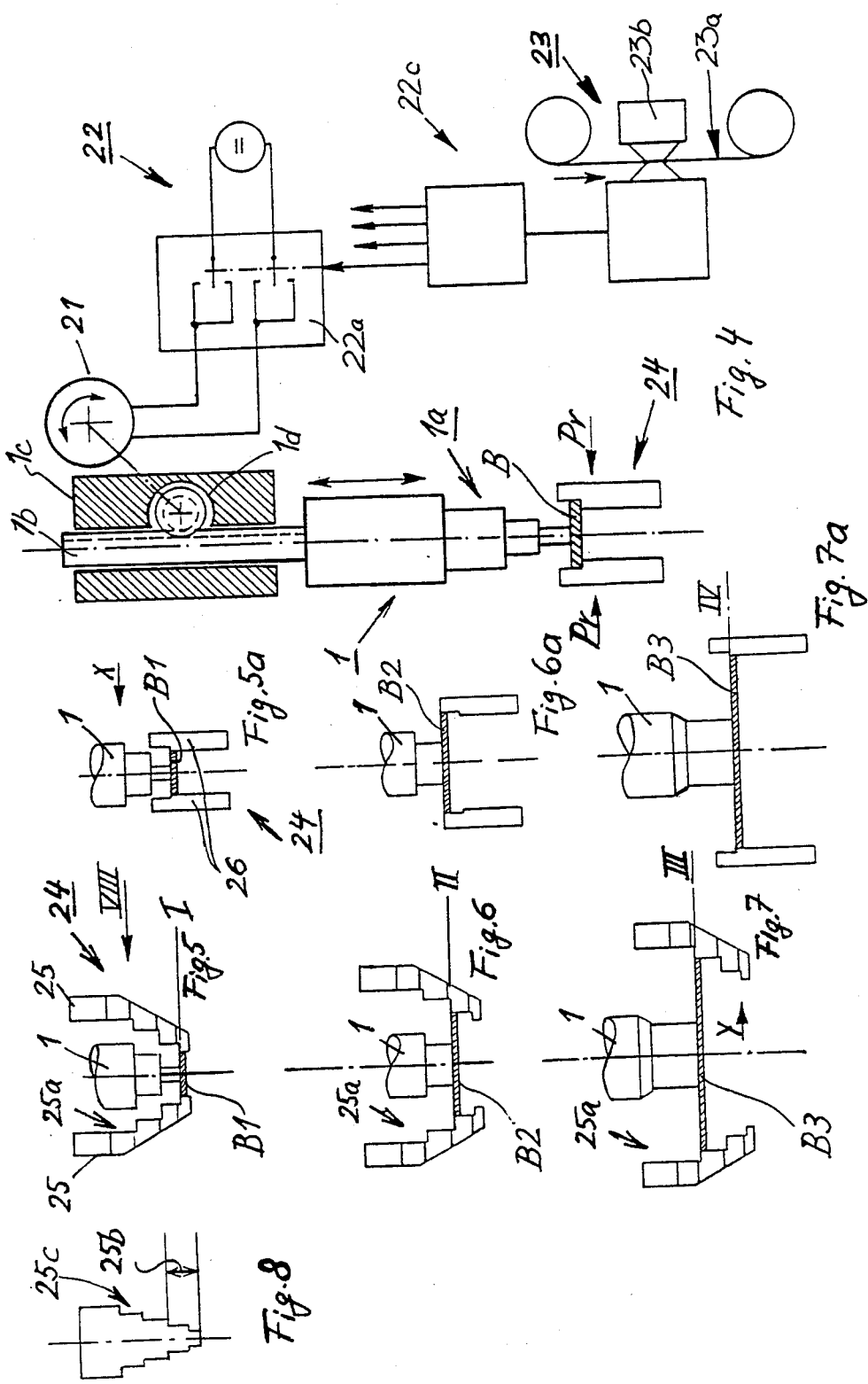

DEVICE FOR PICKING AND TRANSPORTING COMPONENTS

This invention relates to a device for picking and transporting components.

The term "component" may apply here, for example, to mainly electronic components, which are picked up from a magazine, a feed means or the like, or from a conveyor belt, brought to an assembling station, and must be deposited on a component support thereat. On the other hand, the term "component" may also be interpreted in a wider sense and, thus, include any kind of especially tiny and small components up to a dimension of, roughly, 50×50 mm which are to be picked up, transported and deposited again at a predetermined location.

For this purpose, so-called "suction styluses" which have been discussed a number of times in the prior art, have been used satisfactorily. Such a suction stylus includes, essentially, a needle-like, hollow gripping body, open at one end and the inner space of which is connected to a vacuum source. By setting the needle-like gripping element on the part to be picked and transported and then supplying the vacuum, the part can be picked and transported to a predetermined location.

In practice, parts of different sizes must be handled in the way described. The size range extends from a few square millimeters, for example, to hundreds of square millimeters. From the consideration that larger parts are heavier, and, therefore, require a greater suction force, and, on the other hand, offer a greater gripping surface to the suction stylus, and that with smaller parts, the conditions are just the opposite, it appears that the suction styluses must meet different requirements in accordance with the size of the parts.

A suction stylus for small and tiny parts should have as small as possible a diameter, while the necessary suction force, also, need only be very small. In a suction stylus for larger parts, on the other hand, the dimensions themselves play a subordinate part; here, it is important that the suction force be high enough to securely pick up and transport the part. These requirements have, up to now, led to adapting the kind and size of the suction stylus to the parts to be picked and transported, in which case, either compromises or insufficiencies, with the use of the same suction stylus, or a changing of same in accordance with the part to be gripped, had to be tolerated.

The object of the present invention is to avoid these disadvantages and to provide a device for picking and transporting parts of the kind mentioned, which is largely suitable for all kinds of parts whether small or large.

The object is achieved by features recited in the characterized parts of patent claim 1, while the dependent claims recite further additional features of the subject invention and preferred forms of execution of the same.

In the attached drawings, embodiments of the invention are represented schematically.

FIG. 4 is a schematic block function diagram of the device according to the invention with a gripping casing of the kind shown in FIGS. 1 to 3, but with a part-centering device;

FIGS. 5 to 7 shows axial cross-sections of the lower end zone of the gripping casing according to the invention with attached component under suction in vertical positions I, II, and III, respectively, and with a centering device in a receiving position against the component;

FIGS. 5a to 7a each shows a view according to FIGS. 5 to 7, but in a plane rotated by 90° from the longitudinal axis of the gripping casing; and FIG. 8 is a side view of the centering device as seen in the direction of arrow VIII in FIG. 5.

Figure 1:
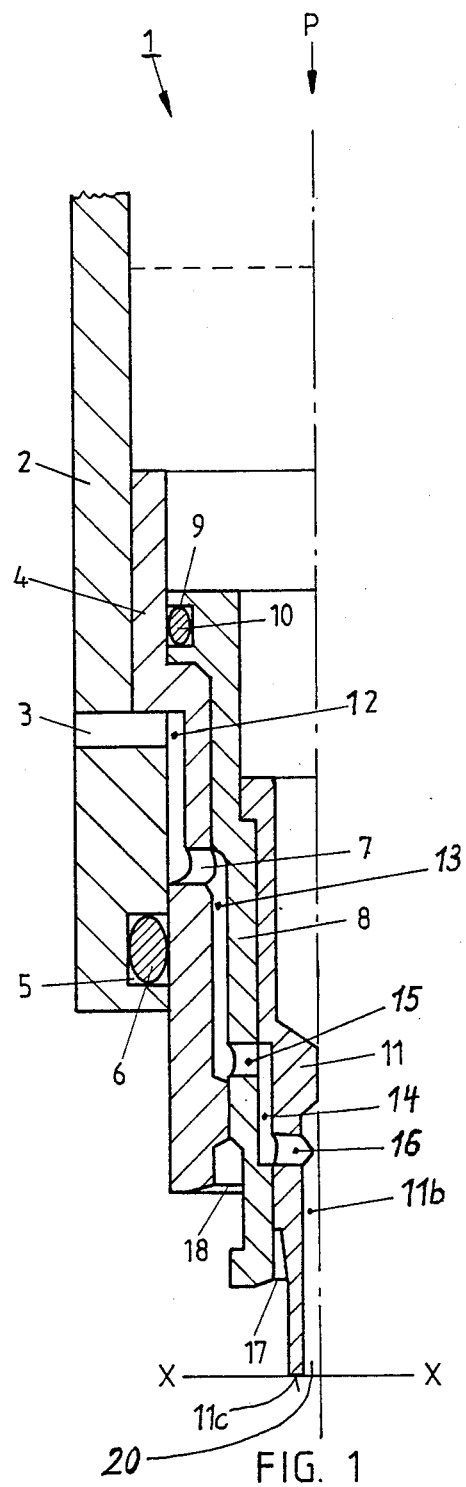
FIG. 1 shows a longitudinal cross-sectional view of a device according to the invention in a first working position in which only one axial-symmetrical half of the device is represented.
Figure 2:
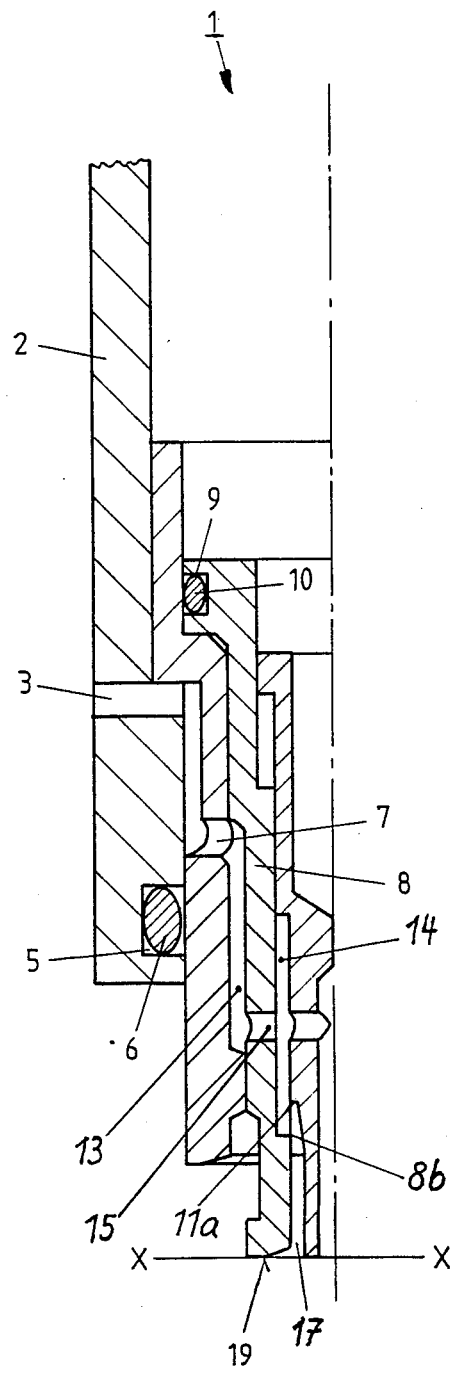
FIG. 2 shows a cross-section similar to FIG. 1 in a second working position.
Figure 3:
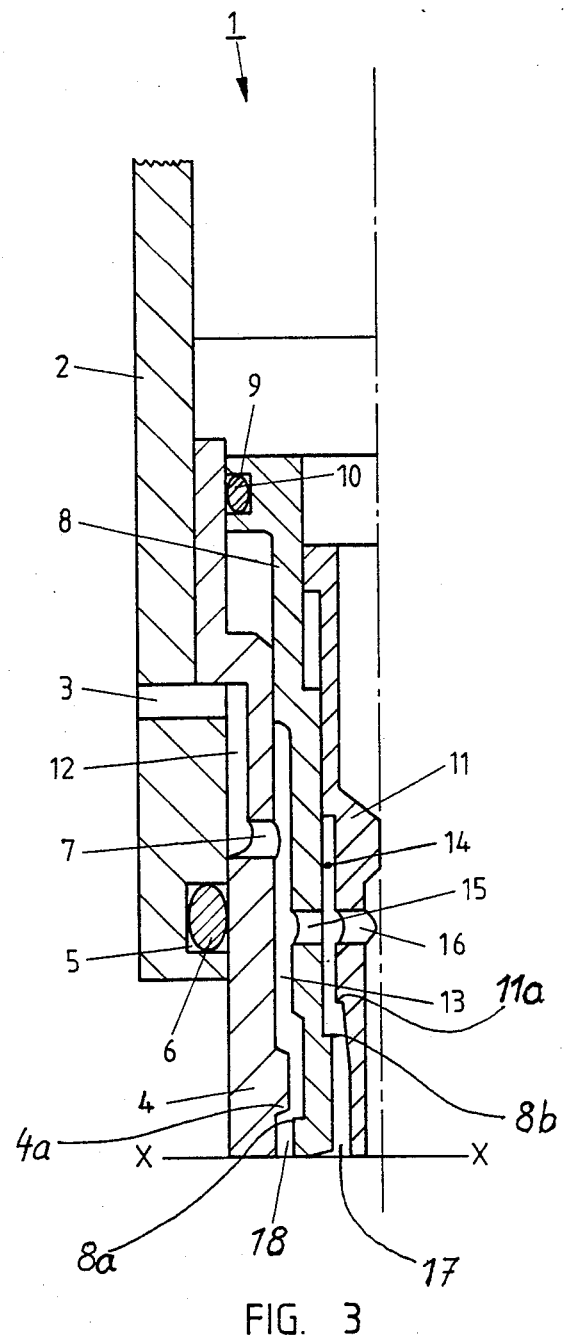
FIG. 3 shows a cross-section similar to FIG. 1 in a third working position.

The device shown in FIGS. 1 to 3 includes a gripping casing generally designated by numeral 1 which comprises a base part 2. The latter is designed as a hollow body and is provided with a bore 3 extending radially inward for connection to a vacuum source (not shown). A first axially movable gripping element 4 is supported in the hollow interior of the base part 2. The sealing between base part 2 and gripping element 4 is effected by an O-ring 6 received in a groove 5.

Independently of the position of the first gripping element 4, a radial bore 7 connects the interior of the element 4 designed as a hollow body with the vacuum inlet 3.

Inside the first gripping element 4 is arranged a second gripping element 8 also movable axially. An O-ring 10 located in a groove 9 seals it from the first gripping element 4.

Inside the second gripping element 8 is arranged a third gripping element 11 also movable axially. The vacuum inlet 3 or a first intermediate chamber 12 connected thereto and arranged between the gripping means base part 2 and the first gripping element 4, is connected to a second intermediate chamber 13 arranged between the first and second gripping elements by a radial bore 7. A third intermediate chamber 14 arranged between the third and second gripping elements, is connected with the second intermediate chamber 13 by a radial bore 15 and therethrough with the vacuum inlet 3. The inner chamber 11b of the third gripping element 11, finally, is connected with the third intermediate chamber 14 by a radial bore 16 and therethrough with the vacuum inlet 3.

FIG. 1 shows a working position of the device in which the three gripping elements 4, 8 and 11 are extended. In particular, it can be seen from FIG. 1 that the innermost third gripping element 11 has the smallest diameter. It is used, therefore, for picking up parts of small and tiny dimensions. In practical operation, this means that the whole gripping casing 1 extends in the axial direction P until the tip 11c of the third gripping body 11 reaches the vertical position of the surface of the component to be gripped. This vertical position is designated in FIGS. 1 to 3, in each case, by the line X—X. After the tip 11c reaches the surface of the component, the vacuum from inlet 3 is supplied through the first intermediate chamber 12, the bore 7, the second intermediate chamber 13, the bore 15, and the third intermediate chamber 14 so that the component is gripped through the suction opening 20, provided at the end of the third gripping element 11. From FIG. 1, it can also be seen that the suction opening 17 provided on the second gripping element, as well as the suction opening 18 provided on the first gripping element, are closed.

If a larger part is to be picked up and transported, the gripping element 1, according to FIG. 2 is lowered from the position indicated in FIG. 1 in the direction of arrow P toward the vertical position X—X. This causes the third gripping element 11 to move axially in the direction opposite of that of the direction of arrow P into the interior of the gripping casing so that the end surface 19 of the second gripping element 8 and, thus, the suction opening 17 also lie on the surface of the component to be gripped.

By this mutual axial movement of the gripping elements, the suction opening 17 on the component end of the second gripping element 8 is connected with the vacuum inlet 3 through the bores 15 and 7 and the intermediate chambers 14, 13 and 12. This means that two concentric suction openings, namely, the suction opening 17 of the third gripping element 11 and the suction opening 20 of the second gripping element 8 are activated. Therefore, a suction surface, larger in area and thus more effective, is available for picking up larger components and transporting the same as necessary.

In FIG. 3, finally, not only the third gripping element 11, but also the second gripping element 8 are moved axially in the direction opposite of the arrow P, so that the suction opening 18, provided for the first gripping element 4, also goes into action. For picking up components larger in area, therefore, all three gripping elements 4, 8 and 11, now come in contact with the part to be gripped, while the vacuum from the inlet 3 acts through the intermediate chamber 12, the bore 7, the intermediate chamber 13, the bore 15, the intermediate chamber 14, the bore 16, and the three ring-form concentric suction openings on the surface of the component.

The telescopic arrangement formed by the gripping elements described above permits, with the axial movement of the gripping elements relative to each other, to control the vacuum supply from the inlet 3, during a lowering movement of the gripping casing, in each case in succession, to the suction openings of the first and second gripping elements, as soon as the suction opening is set onto the component surface. To this end, the gripping elements are provided with pairs of control edges 4a and 8a, and 8b and 11a. In the working position according to FIG. 1, the passages formed by both pairs of control edges are closed; in that of FIG. 2, only the passages of the pair of control edges 4a and 8a are closed, and in that of FIG. 3, the passages of both pairs of control edges are open.

With the above-described device, there exists a possibility of picking up small and tiny components, which require relatively little suction force, with just the third gripper element 11 the dimensions of which are kept small. As soon as middle-sized components are to be gripped, the gripping casing is lowered farther, so that the suction effect of the third gripping element 11 is supported by the suction effect of the second gripping element 8. Correspondingly, the first gripping element 4, which grips concentrically around the second gripping element 8, acts, in support, to pick up relatively large components.

In the device shown in FIG. 4, the gripper means including the telescopic arrangement 1a or gripping elements, is supported for vertical movement by a guiding and drive toothed rack 1b in the device frame 1c shown schematically. The rack 1b engages a driving cogwheel 1d of a gear arrangement not shown in detail and connected in turn with an adjustable reversible motor 21. A respective vertical control device 22 includes a switch 22a which can be switched electrically for reversing the motor 21 connected to a direct current source. The switch 22a, has, besides its two oppositely poled switching positions, a stable shut-off middle position in which the motor is deactuated. In any one position of the three switch positions, the commutator 22d of a control circuit 22c is connected to the switch 22a.

Other commutators, not shown, are provided for bi-axial horizontal control and a rotary control for the gripping casing 1 supported for rotation around its vertical lengthwise axis, and are provided with a corresponding drive device.

Essential to the subject of the present invention, however, is a programmable common memory designated by reference numeral 23 and which includes a memory medium, represented, for example, by a magnetic tape device 23a, with recording and read out station 23b. The latter is designed, in the usual way, as an input station for the command sequence of the process programming, and especially for receiving of a plurality of control commands, each assigned to a predetermined vertical position or run-in position of the gripping element telescopic arrangement 1a. These control commands also allow an assignment to different component surfaces, according to size and/or shape, and thus the turning on of the corresponding run-in position of the telescopic arrangement of gripping elements, with actuation of the proper suction openings, as was explained with reference to FIGS. 1 to 3.

The gripping casing 1, in the example of FIG. 4, is connected with a centering device 24, which grips the component B, held by a gripping casing in a suitable vertical position, according to the arrow Pr, on one of the gripping elements, concentric with the axis of the gripping casing and adjusts it exactly by a radial movement relative to the axis of the gripping means.

FIGS. 5 to 7 show a first pair of centering jaws 25, concentric with the axis of the gripping casing with inner profile 25a, graduated vertically in its inner diameter, with the inner profile increasing upwardly; and, namely, in three different radial positions, according to three different components B1, B2 and B3 having different surface dimensions to be gripped. According to these different components, the gripping casing 1 movable vertically in relation to the centering device 24, takes different vertical positions in relation to the surface of the component, namely, so that the gripping element telescopic arrangement 1a takes a run-in position assigned to the actuation of the proper suction opening. This run-in position may be set, for example, already in picking up the component in question, from a stationary starting position, or into a certain vertical position through the component held fast in the centering jaws, through properly programmed vertical ascent of the gripping casing.

The parts are brought by means of the vertical control described into a vertical position relative to the centering device, which corresponds to a step of the inner profile 25a of the centering jaws 25, assigned to one of the component sizes. For the part B1, this is the low step in vertical position I, in FIG. 5; for the part B2, the second lowest step in vertical position II, in FIG. 6.

As shown in FIG. 8, the centering jaws 25 are provided, even in their width measured tangentially to the gripping casing axis, with an upwardly increasing graduation 25c, of which the vertical steps correspond approximately to those inner profile 25a. The steps are so dimensioned that the lower end section 25b of the centering jaws 25, even in the centering of very small parts between the centering jaws brought very close together, permits a second pair of jaws 26, pivoted by 90° from the axis of the gripper casing, to engage the component. The latter are shown in the respective FIGS. 5a and 6a. Both pairs of jaws can, therefore, be centered upon their radial movement in the two horizontal coordinate directions, according to arrows x and y, while the parts B1 and B2 take their vertical positions, I and II.

In the centering of larger parts, such as the parts B3 in FIGS. 7 and 7a, for example, on the other hand, taking into account a limited horizontal lift of the centering jaws 25, the centering in the y direction into the vertical position III can be carried out with correspondingly greater inner width of profiling 25a, and then the centering in the x direction by means of the jaws 26, into a lower vertical position IV, independently of the jaws 25. For this, the jaws 25 must be moved, in a manner not shown in detail, so that they do not hinder the lowering into the last-mentioned vertical position.

We claim:

1. A device for picking and transporting components, said device comprising:
   an elongate hollow casing movable toward and away from a component and having a vacuum inlet for connection to a vacuum source;
   first and second concentric telescopic gripping elements located in said casing and movable relative to each other, each of said first and second gripping elements having an end surface facing the component and a suction opening formed in said end surface, said casing having a first position in which the end surface of the first gripping element having a suction opening formed therein is located farther away from the component than the end surface of the second gripping element having a suction opening formed therein, and a second position in which the end surfaces comprising a suction opening of the first and second gripping elements are located in a common plane;
   conduit means for communicating said suction openings with said vacuum inlet; and
   means for blocking communication between said vacuum inlet and the suction opening of the first gripping element in the first position of said casing;
   said conduit means comprising first and second axial passages formed in said first and second gripping elements, respectively, for communicating the respective suction openings of said first and second gripping elements with said vacuum inlet, and said blocking means comprising first control edges formed on said first and second gripping elements for blocking communication between said first axial passages and the suction opening of the first gripping element in said first position of said casing.

2. A device according to claim 1 wherein said casing comprises a base element, and said vacuum inlet is formed in said base element.

3. A device according to claim 2 wherein said base element is a hollow cylinder circumscribing said first and second gripping elements, and said first element circumscribes said second element.

4. A device according to claim 3 further comprising a third telescopic gripping element circumscribed by the second telescopic gripping element and movable relative thereto, said third gripping element having an end surface facing the component and a suction opening formed in said end surface, said casing having a third position in which said end surface of said third gripping element projects beyond the end surface of the second gripping element having an opening formed therein, said end surface of said third gripping element lying in a common plane with said end surface of said second gripping element in said first and second positions of said casing.

5. A device according to claim 4 wherein said conduit means comprises first and second radial passages formed in said first and second gripping elements, respectively, said first and second axial passages communicating the respective suction openings of said first and second gripping elements with said first and second radial passages, respectively.

6. A device according to claim 5 wherein said conduit means comprises means for communicating the suction opening of said third gripping element with said vacuum inlet, said communicating means comprising a third radial passage formed in said third gripping element and a third axial passage formed in said third gripping element for communicating the suction opening thereof with said third radial passage, said blocking means comprises second control edges formed on said second and third gripping elements for blocking communication between said second radial and axial passages in the third position of said casing.

7. A device according to claim 4 further comprising means for supporting said casing for movement between said first, second and third positions, means for effecting said movement of said casing, and control means for controlling movement of said casing between said first, second and third positions, said control means comprising a programmable command memory for storing control commands corresponding to said first, second, and third positions of said casing.

8. A device according to claim 7 wherein said command memory has three positions corresponding to said first, second and third positions of said casing which in turn correspond to respective different sizes of components.

9. A device according to claim 1 further comprising a centering device having at least one pair of centering jaws arranged concentrically with said casing, said centering jaws having a stepped axial inner profile, and said casing is movable relative to said centering jaws.

10. A device according to claim 9 wherein inner diameters of steps defined by said stepped axial inner profile increase upward from step-to-step.

11. A device according to claim 9 or 10 wherein said centering jaws have a width measured transverse to the casing axis which increases upward from the lower end of said jaws.

12. A device according to claim 11 wherein said width increases in steps.

13. A device according to claim 11 wherein said centering jaws have a stepped axial outer profile, axial dimensions of steps of the outer profile substantially corresponding to axial dimensions of steps of the inner profile.

14. A device according to claim 1 comprising two pairs of centering jaws arranged concentrically with said gripping casing and crosswise of each other, the centering jaws of one of said pairs of centering jaws having a stepped axial inner profile and a width measured transverse to the casing axis which increases upward from the lower end of said centering jaws of said one pair, and the lower end of said centering jaws of said one pair being located between the centering jaws of the other of said pairs.

* * * * *